US009190550B2

(12) United States Patent
Tagami et al.

(10) Patent No.: US 9,190,550 B2
(45) Date of Patent: Nov. 17, 2015

(54) PHOTODIODE

(71) Applicant: Kabushiki Kaisha Toshiba, Minato-ku, Tokyo (JP)

(72) Inventors: Yuichi Tagami, Fukuoka-ken (JP); Shigeyuki Sakura, Kanagawa-ken (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 14/166,176

(22) Filed: Jan. 28, 2014

(65) Prior Publication Data

US 2015/0069566 A1 Mar. 12, 2015

(30) Foreign Application Priority Data

Sep. 9, 2013 (JP) ................... 2013-186017

(51) Int. Cl.
*H01L 31/105* (2006.01)
(52) U.S. Cl.
CPC .................... *H01L 31/105* (2013.01)
(58) Field of Classification Search
USPC ......................................................... 257/458
See application file for complete search history.

(56) References Cited

U.S. PATENT DOCUMENTS

| 4,651,015 | A * | 3/1987 | Nishizawa et al. ......... 250/208.1 |
| 2006/0216896 | A1* | 9/2006 | Saito et al. .................... 438/270 |
| 2008/0237759 | A1* | 10/2008 | Hasegawa ..................... 257/431 |
| 2009/0243016 | A1 | 10/2009 | Kawahara et al. |
| 2011/0006311 | A1 | 1/2011 | Hadwen et al. |
| 2011/0042766 | A1 | 2/2011 | Kurokawa et al. |
| 2012/0299070 | A1 | 11/2012 | Yamada et al. |

FOREIGN PATENT DOCUMENTS

| JP | 10-041537 A | 2/1998 |
| JP | 2009-239053 A | 10/2009 |
| JP | 2011-066397 A | 3/2011 |
| JP | 2011-518423 A | 6/2011 |
| JP | 2013-012696 A | 1/2013 |
| JP | 2013-191194 A | 9/2013 |

* cited by examiner

*Primary Examiner* — Zandra Smith
*Assistant Examiner* — Lawrence Tynes, Jr.
(74) *Attorney, Agent, or Firm* — White & Case LLP

(57) ABSTRACT

According to one embodiment, a photodiode includes a first semiconductor layer of a first conductivity type, a second semiconductor layer of a second conductivity type, a third semiconductor layer of the first conductivity type, and a film. The second semiconductor layer is provided in the first semiconductor layer. The third semiconductor layer is provided in the first semiconductor layer so as to surround the second semiconductor layer. Each of one ends of the second and third semiconductor layers is located at an upper surface of the first semiconductor layer. The first to third semiconductor layers include first to third impurity concentrations respectively. The second and third impurity concentrations are higher than the first impurity concentration. The film is provided above the third semiconductor layer, and blocks light to enter into a neighborhood of the third semiconductor layer.

21 Claims, 8 Drawing Sheets

PHOTODIODE

CROSS REFERENCE TO RELATED APPLICATION

This application is based upon and claims the benefit of priority from the prior Japanese Patent Application 2013-186017, filed on Sep. 9, 2013, the entire contents of which are incorporated herein by reference.

FIELD

Embodiments described herein are generally related to a photodiode.

BACKGROUND

In the back ground art, lateral pin photodiodes are known. The lateral pin photodiode has a p-type semiconductor layer, an i-type semiconductor layer and an n-type semiconductor layer. The p-type semiconductor layer and the n-type semiconductor layer are disposed parallel to a surface of a semiconductor substrate. The i-type semiconductor layer is interposed between the p-type semiconductor layer and the n-type semiconductor layer.

The lateral pin photodiode detects light to enter into the i-type semiconductor layer.

When the i-type semiconductor layer is a p-type semiconductor layer with a sufficiently low impurity concentration, the n-type semiconductor layer and the i-type semiconductor layer form a pn-junction. A depletion layer of the pn-junction extends to the p-type semiconductor layer side rather than the n-type semiconductor layer side. When light enters into the i-type semiconductor layer, the light is absorbed inside the i-type semiconductor layer to generate carrier.

The carrier which is generated inside the depletion layer flows as drift current. The carrier which is generated outside the depletion layer flows as diffusion current. As a result, a sufficient response speed of the lateral pin photodiode is not obtained.

BRIEF DESCRIPTION OF THE DRAWINGS

FIG. 1A is the plan view of the photodiode. FIG. 1B is the cross-sectional view of the photodiode taken along a line A-A of FIG. 1A.

FIG. 3A is the plan view of the photodiode. FIG. 3B is the cross-sectional view of the photodiode taken along a line B-B of FIG. 3A.

DETAILED DESCRIPTION

Figure 1A:
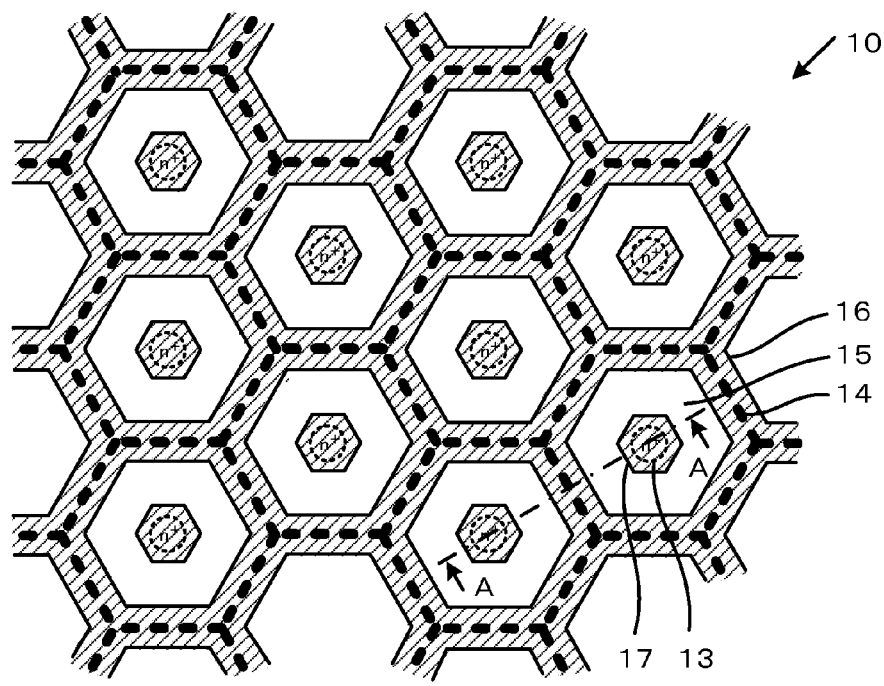
FIGS. 1A and 1B are views showing a photodiode according to an embodiment.

According to one embodiment, a photodiode includes a first semiconductor layer of a first conductivity type, a second semiconductor layer of a second conductivity type, a third semiconductor layer of the first conductivity type, and a film. The first semiconductor layer has a first impurity concentration. The second semiconductor layer is provided in the first semiconductor layer, an one end of the second semiconductor layer being located at an upper surface of the first semiconductor layer, and has a second impurity concentration higher than the first impurity concentration. The third semiconductor layer is provided in the first semiconductor layer so as to surround the second semiconductor layer, an one end of the second semiconductor layer being located at the upper surface of the first semiconductor layer, and has a third impurity concentration higher than the first impurity concentration. The film is provided above the third semiconductor layer, and blocks light to enter into a neighborhood of the third semiconductor layer.

Embodiments will be described below with reference to the drawings. In the drawings, the same reference numerals show the same or similar portions. The same portions in the drawings are denoted by the same numerals and a detailed explanation of the same portions is appropriately omitted, and different portions will be described.

Embodiment

Figure 1B:
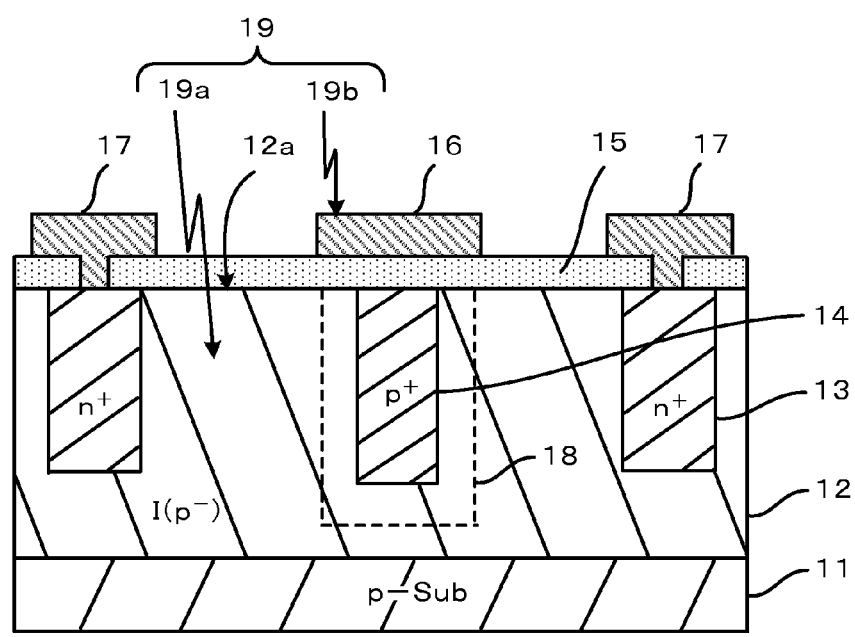

A photodiode in accordance with an embodiment will be described with reference to FIGS. 1A and 1B. FIGS. 1A and 1B are views showing the photodiode of the embodiment. FIG. 1A is the plan view of the photodiode. FIG. 1B is the cross-sectional view of the photodiode taken along a line A-A of FIG. 1A, viewed from the arrows.

The photodiode of the embodiment is a lateral pin-photodiode having a p-type semiconductor layer, an i-type semiconductor layer and a n-type semiconductor layer. The p-type semiconductor layer and the n-type semiconductor layer are disposed parallel to a surface of a semiconductor substrate. The i-type semiconductor layer is interposed between the p-type semiconductor layer and the n-type semiconductor layer.

The lateral pin photodiode detects light to enter into the i-type semiconductor layer. Hereinafter, the lateral pin photodiode is simply referred to as the photodiode.

As shown in FIGS. 1A and 1B, a photodiode 10 of the embodiment is provided on a semiconductor substrate 11. The semiconductor substrate 11 is a p-type (a first conductivity type) silicon substrate, for example. A p-type first semiconductor layer 12 is provided on the semiconductor substrate 11. The first semiconductor layer 12 has a first impurity concentration of approximately $1E13\ cm^{-3}$ and a thickness of approximately 10 μm, for example. Since the first impurity concentration is low enough, the first semiconductor layer 12 is considered to be an i-type semiconductor layer.

An n-type (a second conductivity type) second semiconductor layer 13 is provided in the first semiconductor layer 12, an one end of the second semiconductor layer 13 is located at an upper surface 12a of the first semiconductor layer 12. The second semiconductor layer 13 has a shape of column, for example. The second semiconductor layer 13 has a second impurity concentration of approximately $1E18$ to $1E19\ cm^{-3}$, and a thickness of approximately 3 to 4 μm, for example. The second impurity concentration is higher than the first impurity concentration.

A p-type third semiconductor layer 14 is provided in the first semiconductor layer 12 so as to surround the second semiconductor layer 13, an one end of the third semiconductor layer 14 is located at the upper surface 12a of the first semiconductor layer 12. The third semiconductor layer 14 has a third impurity concentration of approximately 1E18 to 1E19 cm$^{-3}$, and a thickness of approximately 3 to 4 μm, for example. The third impurity concentration is higher than the first impurity concentration.

The distance between the second semiconductor layers 13 is approximately 10 to 20 μm. A width of the third semiconductor layer 14 is approximately 1 to 2 μm.

The third semiconductor layer 14 has a hexagonal shape in which the second semiconductor layer 13 is center, for example. Two or more second semiconductor layers 13 and two or more third semiconductor layers 14 are provided, and are arranged in a honeycomb shape.

The lateral pin photodiode 10 is formed of the third semiconductor layer 14, the first semiconductor layer 12, and the second semiconductor layer 13. The third semiconductor layer 14 is an anode of the photodiode 10, and the second semiconductor layer 13 is a cathode of the photodiode 10.

An insulating film 15 with translucency is provided on the first semiconductor layer 12, the second semiconductor layer 13, and the third semiconductor layer 14. The insulating film 15 is a silicon dioxide film, for example.

A film 16 is provided above the third semiconductor layer 14.
The film 16 is provided on the third semiconductor layer 14 through the insulating film 15. The film 16 is a metallic film, for example.

In plan view, the edge of the film 16 is outside the edge of the third semiconductor layer 14 and inside an edge of a depletion layer. The depletion layer extends to the third semiconductor layer 14 side from a pn junction of the first semiconductor layer 12 and the second semiconductor layer 13. A width of the depletion layer is dependent on the first impurity concentration of the first semiconductor layer 12 and the second impurity concentration of the second semiconductor layer 13, and is approximately 3 to 5 μm.

More specifically, a width of the film 16 is larger than the width of the third semiconductor layer 14.

Since the film 16 prevents a portion of light 19a from entering into the first semiconductor layer 12 when the edge of the film 16 is outside the edge of the depletion layer, a detection sensitivity of the photodiode 10 becomes lower. Accordingly, it is not preferable that the edge of the film 16 is outside the edge of the depletion layer.

An electrode (a first electrode) 17 is provided on the insulating film 15. The electrode 17 is electrically connected to the second semiconductor layer 13 through a via penetrating the insulating film 15. The electrode 17 is a cathode electrode of the photodiode 10. An electrode (a second electrode) not shown is electrically connected to the third semiconductor layer 14. The second electrode is an anode electrode of the photodiode 10.

The light 19 which enters into the first semiconductor layer 12 is absorbed inside the first semiconductor layer 12 to generate carrier (electron-hole pair). The photodiode 10 outputs the generated carrier as photo current. The outputted photo current is taken into a signal processing circuit (not shown). The photo current sequentially reaches the third semiconductor layer 14 from the second semiconductor layer 13 by way of the electrode 17, the signal processing circuit, and the electrode (the second electrode) which is not shown.

Much light 19a among the light 19 enters into the first semiconductor layer 12. Meanwhile, the film 16 prevents the light 19b from entering into a neighborhood 18 of the third semiconductor layer 14.

The light 19a which enters into the first semiconductor layer 12 is absorbed inside the first semiconductor layer 12 to generate carrier. The generated carrier is accelerated by electric field in the depletion layer of the pn junction to flow as drift current with high speed.

When a p-type semiconductor layer and an n-type semiconductor layer are joined, conduction electron and hole couple in the pn junction to form a depletion layer in which majority carrier is lacking. In the depletion layer, the n-type semiconductor layer side is charged in positive, and the p-type semiconductor layer side is charged in negative. Accordingly, electric field to pull back electron and hole to the n-type semiconductor layer and the p-type semiconductor layer respectively is generated, and voltage difference (diffusion potential) is generated at the both ends of the depletion layer. When carrier is injected into the depletion layer, the injected carrier serves as drift current which flows in accordance with the electric field. The higher the impurity concentration is, the larger the diffusion potential becomes.

When the pn junction is a step junction, the diffusion potential is expressed as $VD=(kT/q) \ln (NA \times Nd/ni^2)$. K denotes Boltzmann constant, T denotes absolute temperature, q denotes electric charge, NA denotes acceptor density, ND denotes donor density, and ni denotes intrinsic carrier density.

Figure 2:
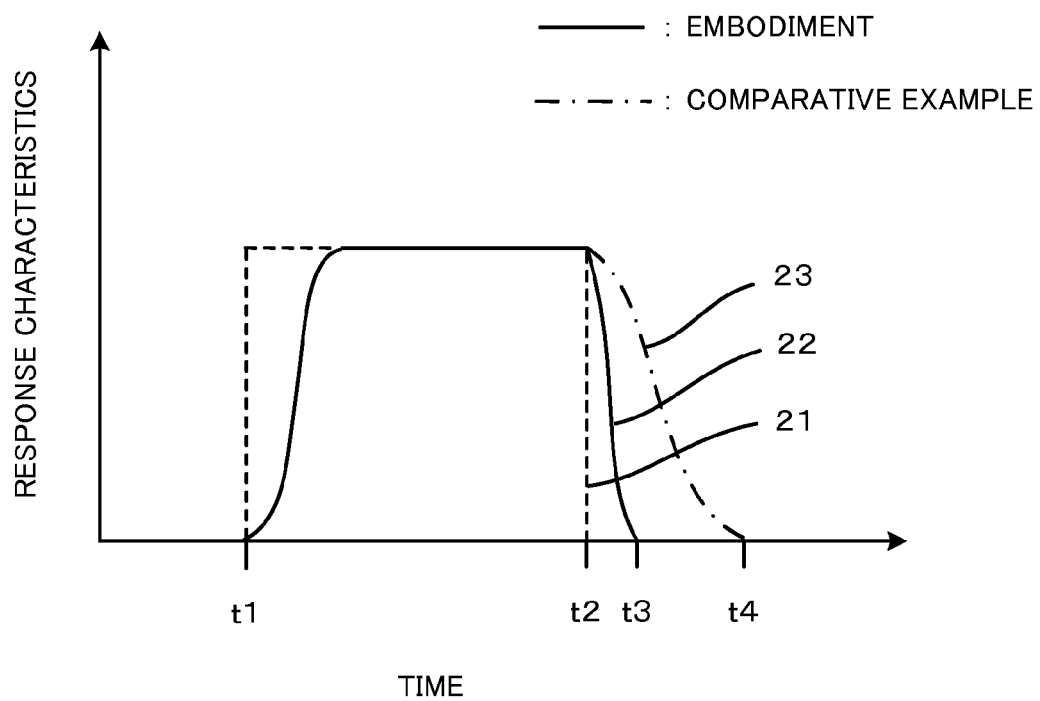
FIG. 2 is a graph showing response characteristics of the photodiode according to the embodiment in comparison with a photodiode of a comparative example.
Figure 3A:
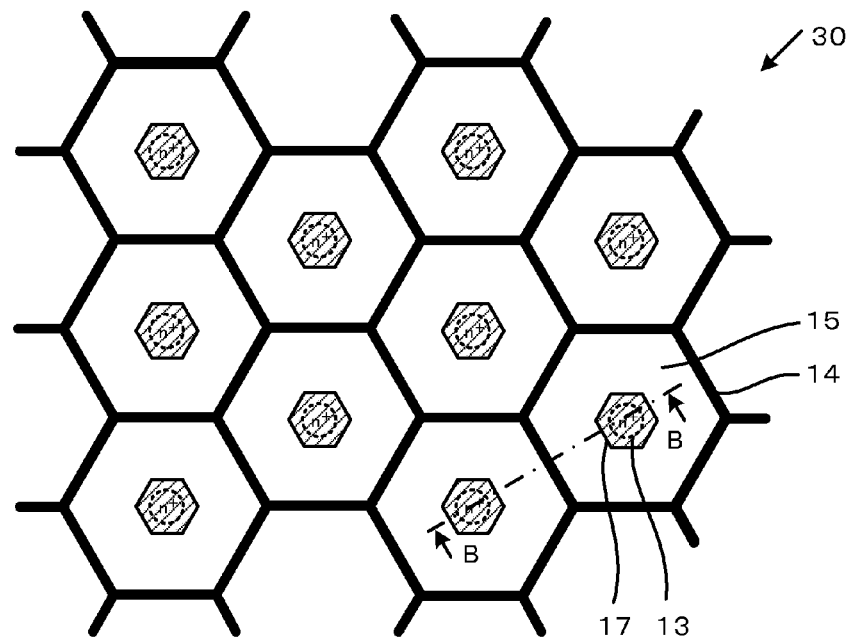
FIGS. 3A and 3B are views showing the photodiode of the comparative example according to the embodiment.
Figure 3B:
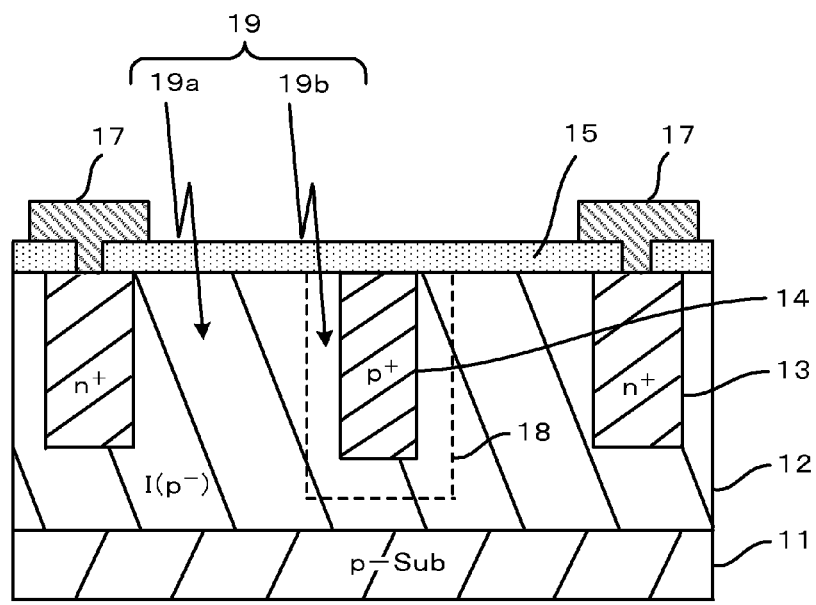

FIG. 2 is a graph showing response characteristics of the photodiode 10 in comparison with a photodiode of a comparative example. FIGS. 3A and 3B are views showing the photodiode of the comparative example. FIG. 3A is the plan view of the photodiode. FIG. 3B is the cross-sectional view of the photodiode taken along a line B-B of FIG. 3A, viewed from the arrows. Firstly, the photodiode of the comparative example will be described.

As shown in FIGS. 3A and 3B, a photodiode 30 of a comparative example has the same fundamental structure as the photodiode 10 shown in FIGS. 1A and 1B. The photodiode 30 is different from the photodiode 10 in that the photodiode 30 does not include the film 16.

Since the photodiode 30 does not include the film 16, the light 19b among the light 19 reaches a portion of the first semiconductor layer 12 which is the neighborhood 18 of the third semiconductor layer 14. The light 19b which reaches the first semiconductor layer 12 is absorbed inside the first semiconductor layer 12 to generate carrier.

Since the neighborhood 18 of the third semiconductor 14 is separated from the edge of the depletion layer (transition region) of the pn junction formed by the first semiconductor layer 11 and the second semiconductor layer 12, the neighborhood 18 of the third semiconductor 14 is a region which is not sufficiently depleted. Accordingly, the carrier which is generated in the neighborhood 18 of the third semiconductor 14 is not affected by the electric field to flow as diffusion current.

A distance between the second semiconductor layer 13 and the third semiconductor layer 14 is approximately 5 to 10 μm, and is larger than the width of the depletion layer with approximately 3 to 5 μm. When the pn junction is a step junction, the width of the depletion layer is expressed as $W=\sqrt{((2\epsilon/q) (1/NA+1/ND) VD)}$. ε denotes permittivity of semiconductor layer.

In FIG. 2, a broken line 21 indicates light signal which enters into photodiodes 10, 30, solid line 22 indicates response characteristics of the photodiode 10, and a chain line 23 indicates response characteristics of the photodiode 30.

As shown in FIG. 2, it is assumed that the light 19 with rectangular wave form is entered at time t1. A rise time of the photodiode 10 is approximately same as a rise time of the photodiode 30.

It is assumed that the light 19 with rectangular wave form is cut off at time t2. A response of the photodiode 10 falls at time t3. A response of the photodiode 30 falls at time t4 longer than time t3. A fall time of the photodiode 10 is shorter than a fall time of the photodiode 30.

Since the photodiode 30 of the comparative example does not include the film 16, the carrier still remains in the neighborhood 18 of the third semiconductor layer 14 after cutting off the light 19. Since the remaining carrier flows as diffusion current with slow speed, the rise time of the photodiode 30 becomes inevitably long.

On the other hand, since the photodiode 10 of the embodiment includes the film 16, the carrier which remains in the neighborhood 18 of the third semiconductor layer 14 after cutting off the light 19 does not exist. Accordingly, the diffusion current with slow speed does not flow. As a result, the film 16 enables the rise time of the photodiode 10 to shorten.

A method of manufacturing the photodiode 10 will be explained. FIGS. 4A, 4B, 5A, 5B and 6 are cross-sectional views showing steps of manufacturing the photodiode 10 in order.

Figure 4A:
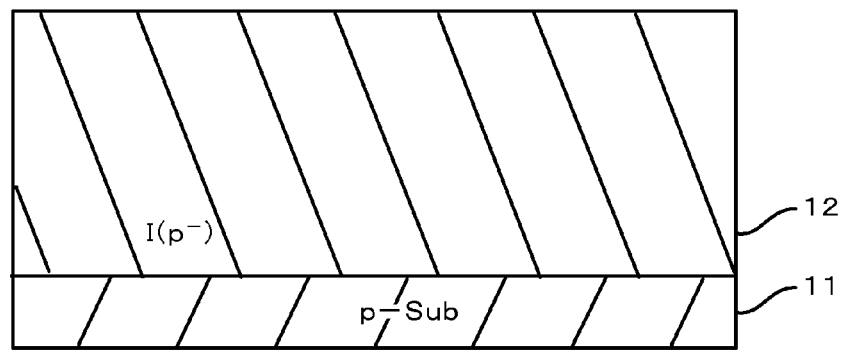
FIGS. 4A, 4B, 5A, 5B and 6 are cross-sectional views showing steps of manufacturing the photodiode in order according to the embodiment.

As shown in FIG. 4A, the first semiconductor layer 12 is epitaxially grown on the silicon substrate 11 by vapor phase growth method, for example. dichlorosilane ($SiH_2Cl_2$) gas is used as a process gas, for example. diborane ($B_2H_6$) gas is used as a dopant gas, for example.

Figure 4B:
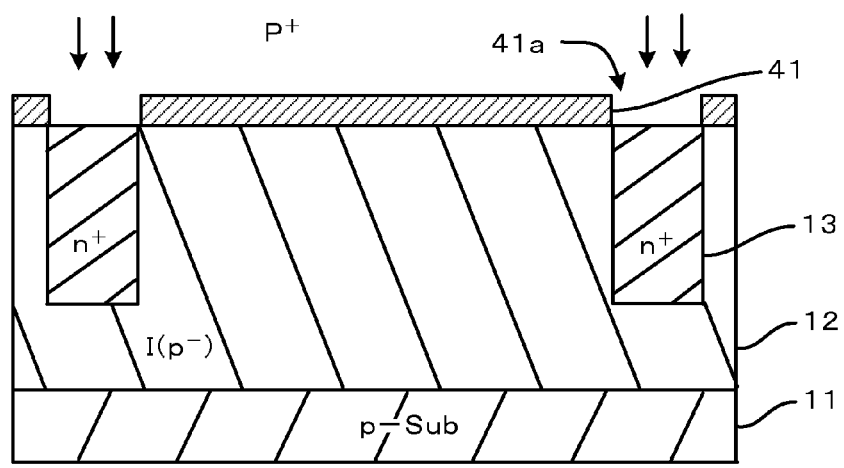

As shown in FIG. 4B, a resist film 41 having an opening 41a to expose a portion of the first semiconductor layer 12 in which the second semiconductor layer 13 is to be formed is formed on the first semiconductor layer 12 by photolithography method. The second semiconductor layer 13 is formed by implanting phosphor ion ($P^+$) into the portion of the first semiconductor layer 12 using the resist film 41 as a mask.

Figure 5A:
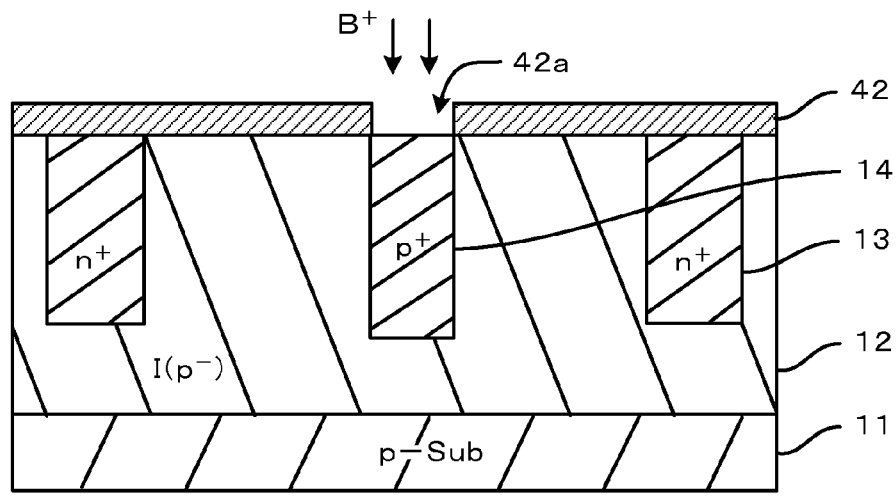

As shown in FIG. 5A, a resist film 42 having a honeycomb shaped opening 42a to expose a portion of the first semiconductor layer 12 in which the third semiconductor layer 14 is to be formed is formed on the first semiconductor layer 12 by photolithography method. The third semiconductor layer 14 is formed by implanting boron ion ($B^+$) into the portion of the first semiconductor layer 12 using the resist film 42 as a mask.

Figure 5B:
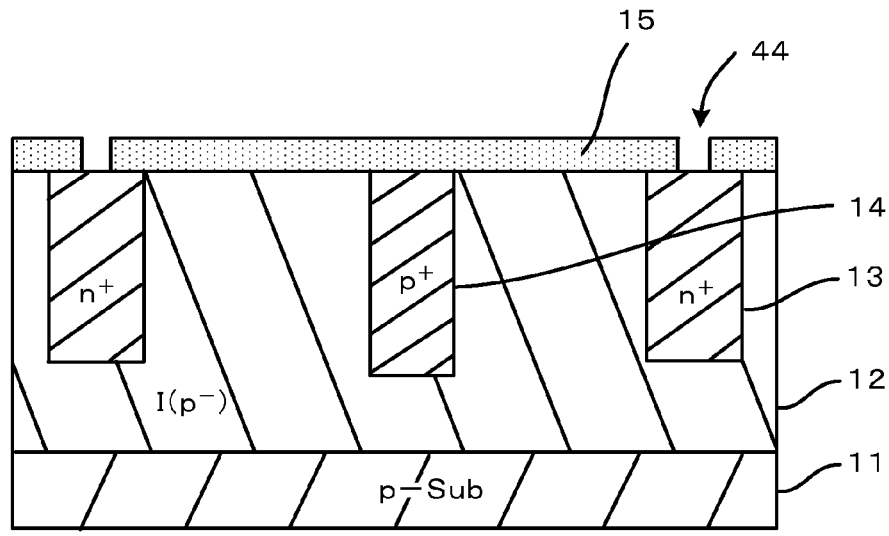

As shown in FIG. 5B, a silicon oxide film as the insulating film 15 is formed on the first to third semiconductor layers 12, 13, 14 by chemical vapor deposition (CVD) method, for example. An opening 44 to expose a portion of the second semiconductor layer 13 is formed in the insulating film 15 by photolithography method.

Figure 6:
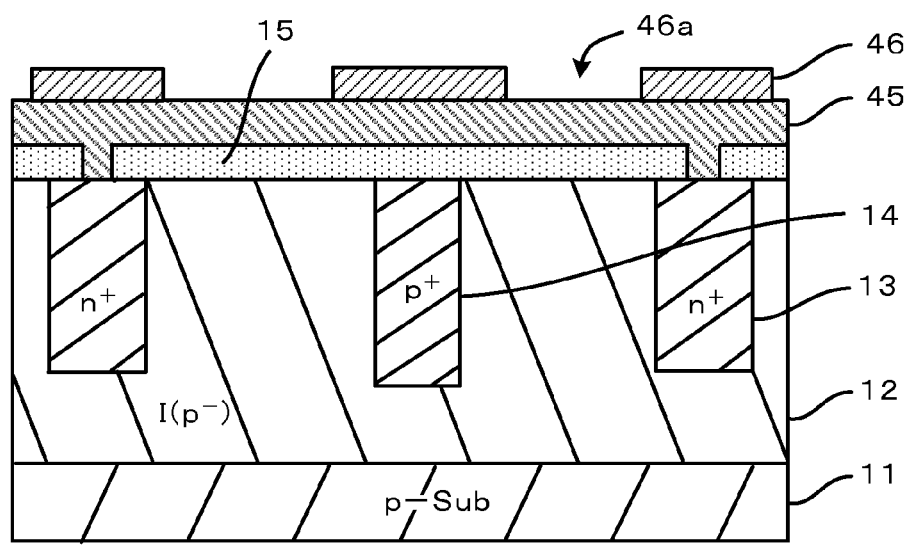

As shown in FIG. 6, a metallic film 45 to fill the opening 44 and cover the insulating film 15 is formed by sputtering method, for example. The metallic film 45 is an aluminum film, for example. A resist film 46 having an opening 46a to expose a portion of the metallic film 45 except a region in which the film 16 and the electrode 17 are to be formed is formed on the metallic film 45 by photolithography method.

The metallic film 45 is removed using the resist film 46 as a mask by reactive ion etching (RIE) method, for example. Accordingly, the electrode 17 which is electrically connected to the second semiconductor layer 13 and the film 16 which blocks the light 19b entering into the neighborhood 18 of the third semiconductor layer 14 are simultaneously formed.

As described above, since the photodiode 10 of the embodiment has the film 16 to block the light 19b which enters into the neighborhood 18 of the third semiconductor layer 14, the carrier is not generated into the neighborhood 18 of the third semiconductor layer 14. Accordingly, since the carrier which remains into the neighborhood 18 of the third semiconductor layer 14 when the light 19 is cut off does not exist, the fall time of the photodiode 10 can be shortened. As a result, a photodiode with a fast response speed is obtained.

The description has been made here as to the case where the third semiconductor layer 14 has the honeycomb shape. However, another shape such as a ring shape and a grid shape may be available as long as the third semiconductor layer 14 surrounds the second semiconductor layer 13. Since a distance between the second semiconductor layer 13 and the third semiconductor layer 14 becomes constant when the third semiconductor layer 14 has the ring shape, a distance between the third semiconductor layer 14 and the edge of the depletion layer also becomes constant. An advantage that a margin of the film 16 is increased is obtained. The margin means an acceptable range of the position of the edge of the film 16, for example.

The description has been made as to the case where a reverse bias voltage is not applied to the photodiode 10. However, the reverse bias voltage may be applied to the photodiode 10. Since the depletion layer further extends to the third semiconductor layer 14 side by applying reverse bias voltage to the photodiode 10, an advantage that the margin of the film 16 is further increased is obtained.

Figure 7:
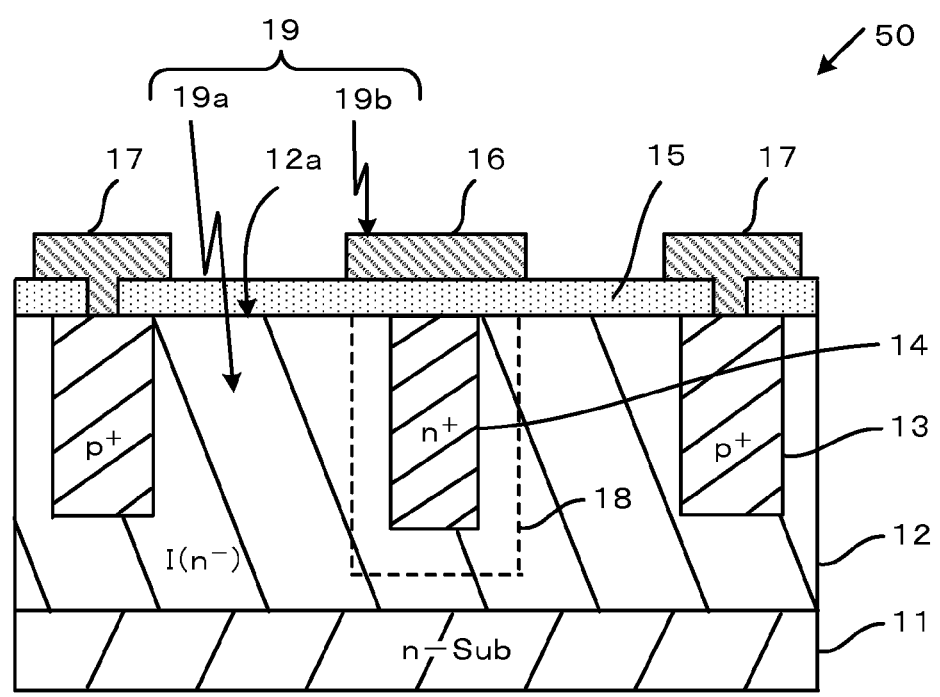
FIG. 7 is a cross-sectional view showing another photodiode according to the embodiment.

The description has been made as to the case where the first conductivity type is p-type and the second conductivity type is n-type. However, the same advantage may be obtained when the first conductivity type is the n-type and the second conductivity type is the p-type. FIG. 7 is a cross-sectional view showing a photodiode 50 in which the first conductivity type is the n-type and the second conductivity type is the p-type.

The photodiode 50 is the same as the photodiode 10 shown in FIGS. 1A and 1B except the conductivity type. The explanation of the photodiode 50 is omitted.

Figure 8:
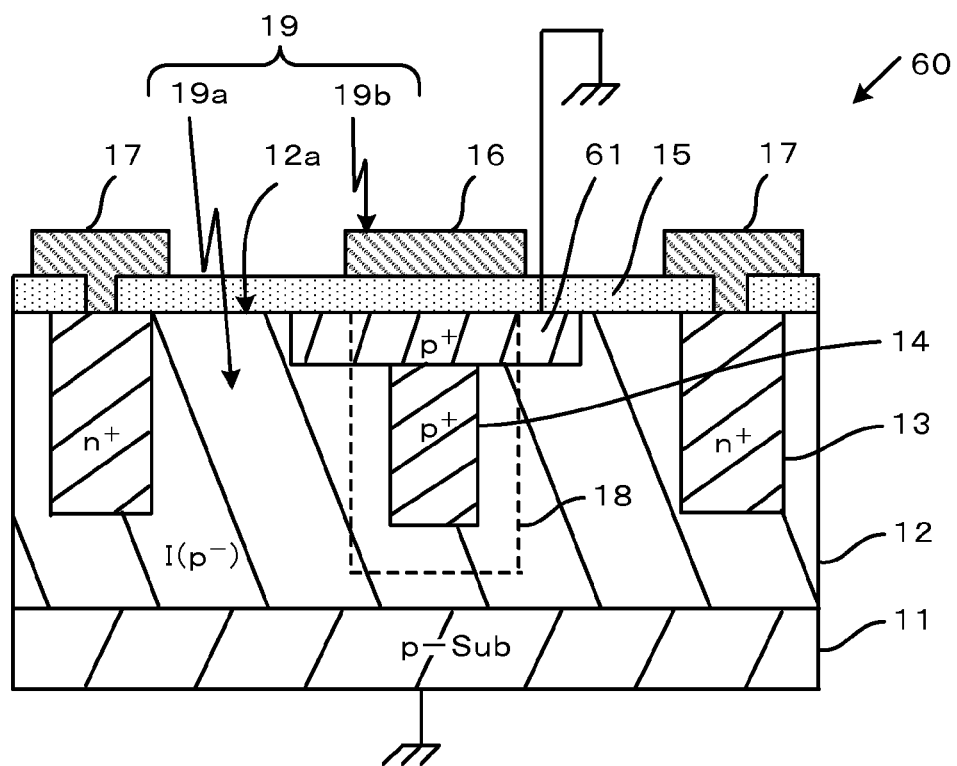
FIG. 8 is a cross-sectional view showing another photodiode according to the embodiment.

A shield layer to shield electromagnetic noise may be provided on the photodiode. FIG. 8 is a cross-sectional view showing a photodiode having a shield layer.

As shown in FIG. 8, in a photodiode 60, a p-type fourth semiconductor layer (a shield layer) 61 is provided in the first semiconductor layer 12, an one end of the fourth semiconductor layer 61 is located at the upper surface 12a of the first semiconductor layer 12, the third semiconductor layer 14 is provided in the first semiconductor layer 12, an one end of the third semiconductor layer 14 is located at the other end of the fourth semiconductor layer 61.

A width of the fourth semiconductor layer 61 is larger than the width of the third semiconductor layer 14. The fourth semiconductor layer 61 has a fourth impurity concentration of approximately $1E18$ $cm^{-3}$ and a thickness of approximately 0.2 μm. The fourth impurity concentration is higher than the first impurity concentration. The width of the fourth semiconductor layer 61 is not especially limited unless the fourth semiconductor layer 61 is in contact with the second semiconductor layer 13.

The fourth semiconductor layer 61 and the substrate 11 are connected to ground (a common voltage line). Since the first semiconductor layer 12 is interposed between the fourth semiconductor layer 61 and the substrate 11 which are connected to the ground, the electromagnetic noise is prevented from entering into the first semiconductor layer 12. The fourth semiconductor layer 61 functions as a shield layer to shield the electromagnetic noise.

Since the fourth semiconductor layer 61 has the width within a range in which absorption of the light 19 is disregarded, the fourth semiconductor layer 61 does not affect a detection sensitivity of the photodiode 60.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A photodiode, comprising:
   a first semiconductor layer of a first conductivity type having a first impurity concentration;
   a second semiconductor layer of a second conductivity type provided in the first semiconductor layer, one end of the second semiconductor layer being located at an upper surface of the first semiconductor layer, and having a second impurity concentration higher than the first impurity concentration;
   a third semiconductor layer of the first conductivity type provided in the first semiconductor layer so as to surround the second semiconductor layer, one end of the third semiconductor layer being located at the upper surface of the first semiconductor layer, and having a third impurity concentration higher than the first impurity concentration; and
   a film provided above the third semiconductor layer, and blocking light to enter into a neighborhood of the third semiconductor layer.

2. The photodiode according to claim 1, wherein
   a width of the film is larger than a width of the third semiconductor layer, and an edge of the film is in the third semiconductor layer side from an edge of a depletion layer, the depletion layer extending to the third semiconductor layer side from a pn junction of the first and second semiconductor layers.

3. The photodiode according to claim 1, wherein
   the third semiconductor layer with a polygon shape or a circle shape surrounds the second semiconductor layer in a shape of polygon or circle.

4. The photodiode according to claim 1, further comprising a fourth semiconductor layer of the first conductivity type provided in the first semiconductor layer, one end of the fourth semiconductor layer being located at the upper surface of the first semiconductor layer, and having a width larger than a width of the third semiconductor layer and a fourth impurity concentration higher than the first impurity concentration, wherein
   the end of the third semiconductor layer is located at a lower surface of the fourth semiconductor layer.

5. The photodiode according to claim 4, wherein
   the fourth semiconductor layer is electrically connected to a common voltage line.

6. The photodiode according to claim 1, wherein
   the first semiconductor layer is provided on a semiconductor substrate of the first conductivity type.

7. The photodiode according to claim 6, wherein
   the semiconductor substrate is electrically connected to a common voltage line.

8. The photodiode according to claim 1, further comprising:
   a first electrode electrically connected to the second semiconductor layer; and
   a second electrode electrically connected to the third semiconductor layer.

9. The photodiode according to claim 1, wherein
   the third semiconductor layer is substantially equal to the first semiconductor layer in thickness.

10. The photodiode according to claim 1, further comprising an insulating film with translucency provided on at least the first and third semiconductor layers, wherein the film is provided on the insulating film.

11. The photodiode according to claim 1, wherein
    the film surrounds the second semiconductor layer in plan view.

12. A photodiode, comprising:
    a first semiconductor layer of a first conductivity type having a first impurity concentration;
    a second semiconductor layer of a second conductivity type provided in the first semiconductor layer, one end of the second semiconductor layer being located at an upper surface of the first semiconductor layer, and having a second impurity concentration higher than the first impurity concentration;
    a third semiconductor layer of the first conductivity type provided in the first semiconductor layer so as to surround the second semiconductor layer, one end of the third semiconductor layer being located below the upper surface of the first semiconductor layer and having a third impurity concentration higher than the first impurity concentration;
    a film provided above the third semiconductor layer, and blocking light to enter into a neighborhood of the third semiconductor layer; and
    a fourth semiconductor layer of the first conductivity type provided in the first semiconductor layer, one end of the fourth semiconductor layer being located at the upper surface of the first semiconductor layer, the other end of the fourth semiconductor layer reaching the one end of the third semiconductor layer, and having a width larger than a width of the third semiconductor layer and a fourth impurity concentration higher than the first impurity concentration.

13. The photodiode according to claim 12, wherein
    a width of the film is larger than the width of the third semiconductor layer, and an edge of the film is in the third semiconductor layer side from an edge of a depletion layer, the depletion layer extending to the third semiconductor layer side from a pn junction of the first and second semiconductor layers.

14. The photodiode according to claim 12, wherein
    the third semiconductor layer with a polygon shape or a circle shape surrounds the second semiconductor layer.

15. The photodiode according to claim 12, wherein
    the fourth semiconductor layer is electrically connected to a common voltage line.

16. The photodiode according to claim 12, wherein
    the first semiconductor layer is provided on a semiconductor substrate of the first conductivity type.

17. The photodiode according to claim 16, wherein
    the semiconductor substrate is electrically connected to the common voltage line.

18. The photodiode according to claim 12, further comprising:
    a first electrode electrically connected to the second semiconductor layer; and
    a second electrode electrically connected to the third semiconductor layer.

19. The photodiode according to claim 12, wherein
    the third semiconductor layer is substantially equal to the first semiconductor layer in thickness.

20. The photodiode according to claim 12, further comprising an insulating film with translucency provided on at least the first and fourth semiconductor layers, wherein the film is provided on the insulating film.

21. A photodiode, comprising:
a first semiconductor layer of a first conductivity type having a first impurity concentration;
a second semiconductor layer of a second conductivity type provided in the first semiconductor layer, one end of the second semiconductor layer being located at an upper surface of the first semiconductor layer, and having a second impurity concentration higher than the first impurity concentration;
a third semiconductor layer of the first conductivity type provided in the first semiconductor layer so as to surround the second semiconductor layer, one end of the third semiconductor layer being located at the upper surface of the first semiconductor layer, and having a third impurity concentration higher than the first impurity concentration; and
a film provided above the third semiconductor layer so as to surround the second semiconductor layer in plain view, and a width of the film being larger than a width of the third semiconductor layer.

* * * * *